United States Patent
Eom et al.

(10) Patent No.: US 12,080,783 B2
(45) Date of Patent: Sep. 3, 2024

(54) SPIN TRANSISTORS BASED ON VOLTAGE-CONTROLLED MAGNON TRANSPORT IN MULTIFERROIC ANTIFERROMAGNETS

(71) Applicant: Wisconsin Alumni Research Foundation, Madison, WI (US)

(72) Inventors: Chang-Beom Eom, Madison, WI (US); Tianxiang Nan, Ithaca, NY (US); Jonathon Schad, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 883 days.

(21) Appl. No.: 16/809,970

(22) Filed: Mar. 5, 2020

(65) Prior Publication Data

US 2021/0280772 A1 Sep. 9, 2021

(51) Int. Cl.
H10N 50/20 (2023.01)
H01L 29/66 (2006.01)

(52) U.S. Cl.
CPC ....... H01L 29/66984 (2013.01); H10N 50/20 (2023.02)

(58) Field of Classification Search
CPC ............ H01L 29/66984; H01F 10/32; H01F 10/1933; H10N 50/00–85; H10N 52/00–85
See application file for complete search history.

(56) References Cited

U.S. PATENT DOCUMENTS

| | | | |
|---|---|---|---|
| 8,860,006 B2 | 10/2014 | Wang et al. | |
| 10,361,292 B2 | 7/2019 | Nikonov | |
| 2005/0017269 A1* | 1/2005 | Miyazawa | H01L 27/11502 257/E21.664 |
| 2007/0064351 A1 | 3/2007 | Wang | |
| 2007/0164336 A1* | 7/2007 | Saito | H01L 43/10 257/E27.005 |
| 2009/0057793 A1* | 3/2009 | Koga | H01F 10/3272 257/421 |
| 2009/0279353 A1* | 11/2009 | Worledge | H01L 29/66984 365/171 |

(Continued)

FOREIGN PATENT DOCUMENTS

| | | |
|---|---|---|
| CN | 103515426 A | 1/2014 |
| KR | 10-2018-0097028 | 8/2018 |
| WO | WO 2013/170070 | 11/2013 |

OTHER PUBLICATIONS

Chumak, A. V. et al. Magnon transistor for all-magnon data processing. Nat. Commun. 5:4700 doi: 10.1038/ncomms5700 (2014). (Year: 2014).*

(Continued)

Primary Examiner — Yu Chen
(74) Attorney, Agent, or Firm — Bell & Manning, LLC (57) ABSTRACT

Voltage-controlled spin field effect transistors ("spin transistors") and methods for their use in switching applications are provided. In the spin transistors, spin current is transported from a spin injection contact to a spin detection contact through a multiferroic antiferromagnetic channel via magnon propagation. The spin current transport is modulated by the application of a gate voltage that increases the number of domain boundaries the multiferroic antiferromagnetic material.

14 Claims, 5 Drawing Sheets

(56) References Cited

U.S. PATENT DOCUMENTS

| | | | | |
|---|---|---|---|---|
| 2009/0302886 | A1* | 12/2009 | Karg | G11C 11/161 257/295 |
| 2010/0084633 | A1 | 4/2010 | Kim | |
| 2011/0233524 | A1* | 9/2011 | Wang | B82Y 10/00 257/295 |
| 2012/0213964 | A1* | 8/2012 | Goyal | C30B 23/02 428/141 |
| 2013/0147579 | A1* | 6/2013 | Ito | G11C 11/16 333/147 |
| 2013/0299880 | A1* | 11/2013 | Du | H10N 50/10 438/3 |
| 2014/0321199 | A1 | 10/2014 | Han | |
| 2017/0346149 | A1* | 11/2017 | Ciubotaru | H01F 10/32 |
| 2018/0240896 | A1* | 8/2018 | Nikonov | G11C 11/223 |
| 2018/0351079 | A1* | 12/2018 | Suzuki | H10N 50/80 |
| 2019/0207093 | A1 | 7/2019 | Han et al. | |
| 2019/0386120 | A1* | 12/2019 | Lin | H01F 10/329 |
| 2021/0125653 | A1* | 4/2021 | Sonobe | H10N 50/80 |

OTHER PUBLICATIONS

Balinskiy, M., Chavez, A.C., Barra, A. et al. Magnetoelectric Spin Wave Modulator Based On Synthetic Multiferroic Structure. Sci Rep 8, 10867 (2018). https://doi.org/10.1038/s41598-018-28878-w (Year: 2018).*
Risinggård V, Kulagina I, Linder J. Electric field control of magnon-induced magnetization dynamics in multiferroics. Sci Rep. Aug. 24, 2016;6:31800. doi: 10.1038/srep31800. PMID: 27554064; PMCID: PMC4995464. (Year: 2016).*
Chenglong Jia, Jamal Berakdar; Multiferroic oxides-based flash memory and spin-field-effect transistor. Appl. Phys. Lett. Jul. 6, 2009; 95 (1): 012105. https://doi.org/10.1063/1.3173203 (Year: 2009).*
F. Wang et al., "Design of Reconfigurable Spin-Wave Nanochannels Based on Strain-Mediated Multiferroic Heterostructures and Logic Device Applications," in IEEE Transactions on Electron Devices, vol. 69, No. 4, pp. 1650-1657, Apr. 2022, doi: 10.1109/TED.2021. 3135486. (Year: 2022).*
Yan Song et al., "Lattice and spin dynamics in multiferroic BiFeO3 and RMnO3", National Science Review, vol. 6, Issue 4, Jul. 2019, pp. 642-652 (Year: 2019).*
International Search Report and Written Opinion for PCT/US2021/020678, dated Dec. 7, 2021.
Das et al., "Modulation of magnon spin transport in a spin transport in a magnetic gate transistor," Physical Review, Feb. 25, 2020, vol. 101, Iss. 5, pp. 1-5.
Rana et al., "Towards magnonic devices based on voltage-controlled magnetic anisotropy," Communications Physics, vol. 2, Aug. 1, 2019, Article No. 90, pp. 1-12.
Chumak, A. V., et al. "Magnon spintronics." Nature Physics 11.6 (2015).
Žutić, Igor, and Jeongsu Lee. "Spin twists in a transistor." Science 337.6092 (2012): 307-308.
Gong et al., Electrically induced 2D half-metallic antiferromagnets and spin field effect transistors, PNAS, Aug. 21, 2018, vol. 115, No. 34 pp. 8511-8516.
Takase et al., "Highly Efficient Gate Controllability of Rashba Spin-orbit Interaction in a Gate-all-around InAs Nanowire MOSFET," NTT Technical Review, vol. 17 No. 2, Feb. 2019, pp. 56-62.
Bertinshaw et al., "Direct evidence for the spin cycloid in strained nanoscale bismuth ferrite thin films," Nature Communications, published Sep. 2, 2016, 7 pages.
Burns et al., "Expansion of the spin cycloid in multiferroic $BiFeO_3$ thin films" npj Quantum Materials (2019) 18, 8 pages.
Price et al., Strain Engineering a Multiferroic Monodomain in Thin-Film $BiFeO_3$ Physical Review Applied 11, 024035 (2019).
Bae et al., "Ferroelastic switching for nanoscale non-volatile magnetoelectric devices," Nature Materials, published Feb. 28, 2010, vol. 9.
Saenrang et al.j "Deterministic and robust room-temperature exchange coupling in monodomain multiferroic $BiFeO_3$ heterostructures," Nature Communications, 2017.
Lebeugle et al., "Exchange coupling with the multiferroic compound $BiFeO_3$ in antiferromagnetic multidomain films and single domain crystals," Physical Review B 81, 134411 (2010).
Lebrun et al., "Tunable long-distance spin transport in a crystalline antiferromagnetic iron oxide," Nature, vol. 561, Sep. 13, 2018.
Datta, Supriyo, and Biswajit Das. "Electronic analog of the electro-optic modulator." Applied Physics Letters 56.7 (1990): 665-667.
Kuo et al., ,,Single-domain multiferroic $BiFeO^3$ films, Nature Communications, Sep. 1, 2016, 7 pages.
Bulletin of the American Physical Society, Abstract for APS March Meeting Mar. 2-6, 2020.
Zhu, Mingmin, Tianxiang Nan, Bin Peng, Yijun Zhang, Ziyao Zhou, Xi Yang, Wei Ren, Nian X. Sun, and Ming Liu. "Advances in magnetics epitaxial multiferroic heterostructures and applications." IEEE Transactions on Magnetics 53, No. 10 (2017): 1-16.
European Patent Office. Extended European Search Report. Mar. 11, 2024.

* cited by examiner

SPIN TRANSISTORS BASED ON VOLTAGE-CONTROLLED MAGNON TRANSPORT IN MULTIFERROIC ANTIFERROMAGNETS

REFERENCE TO GOVERNMENT RIGHTS

This invention was made with government support under W911NF-17-1-0462 awarded by the ARMY/ARO and 1629270 awarded by the National Science Foundation. The government has certain rights in the invention.

BACKGROUND

Spin field effect transistors regulate spin current transmitted from a spin injector to a spin detector through a spin channel, which transmits the spin current via magnon propagation. As such, spin field effect transistors may be viewed as the spintronics analog of conventional field effect transistors. Spin field effect transistors offer several advantages over conventional transistors, including lower power consumption, faster switching speeds, and non-volatility.

Since the first spin field effect transistor was proposed by Das and Datta, several spin field effect transistor designs have been proposed. (S. Datta, B. Das, et al., Appl. Phys. Lett. 56 665 (1990)). These include recent examples of spin field effect transistors that use ferromagnetic or antiferromagnetic insulators as spin channel materials. (Lebrun, R., et al. "Tunable long-distance spin transport in a crystalline antiferromagnetic iron oxide." *Nature* 561.7722 (2018): 222-225.) In these transistors, magnon transport in the channel is controlled using a large magnetic field, which renders the transistors difficult to scale down to practical dimensions.

SUMMARY

Voltage-controlled spin transistors and methods of operating the spin transistors are provided.

One embodiment of a voltage-controlled spin transistor includes: a spin injector contact; a spin detector contact; a layer of a multiferroic material that forms a channel between the spin injector contact and the spin detector contact; at least one top gate contact; and at least one bottom gate contact, wherein the at least one top gate contact and the at least one bottom gate contact are configured to apply a gate voltage across the channel.

One embodiment of a method of operating a spin transistor of the type described herein includes the steps of: creating a spin current in the spin injector contact, whereby the spin current is injected into the channel and transported through the channel to the spin detector contact via magnon propagation; and applying a gate voltage across the channel, wherein the application of the gate voltages increases the density of domain boundaries in the channel and attenuates spin current transport through the channel. The spin transistor can then be switched back to its high spin current transport state by the application of a negative voltage across the channel.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Spin field effect transistors are provided. In the spin transistors, spin current transport through a multiferroic antiferromagnetic channel is controlled by the application of a gate voltage, which changes the domain structure of the channel and attenuates spin current transport. The use of electrical voltages, rather than strong magnetic fields, to modulate spin current renders the transistors efficient, scalable, and readily integratable with existing integrated circuit fabrication schemes.

Figure 1:
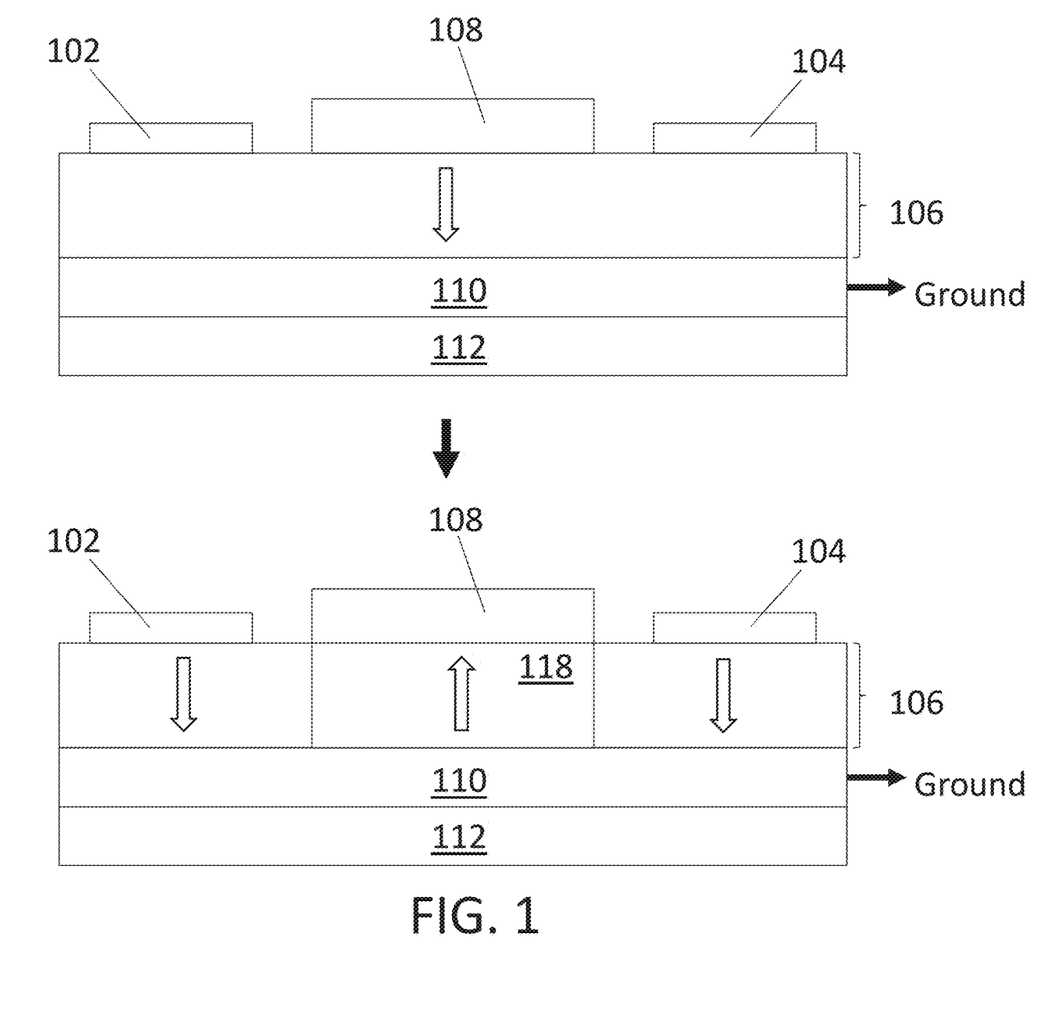
FIG. 1 is a schematic diagram of a voltage-controlled spin transistor in the on state (upper panel) and in the off state (lower panel).

One embodiment of a voltage-controlled spin field effect transistor (also referred to as a spin transistor, for short) is shown schematically in FIG. 1. The spin transistor includes a spin injector contact 102, a spin detector contact 104, and a channel 106 that provides a path for a spin current transfer from spin injector contact 102 to spin detector contact 104. The transistor further includes a top gate contact 108 and a bottom gate contact 110 configured to apply a gate voltage across (i.e., through the thickness of) channel 106. The top and bottom gate contacts are configured to apply a gate voltage across channel 106 provided they are positioned with respect to the channel and to one another in a manner that enables the application of a voltage across the channel. By way of illustration, top gate contact 108 and bottom gate contact 110 can be positioned on the top and bottom surfaces of channel 106, respectively, as shown in FIG. 1. The spin transistor will also typically include a substrate 112. In the spin transistor of FIG. 1, a single top gate contact and a single bottom gate contact are used. However, in other embodiments, multiple top gate contacts can be used with a single bottom gate contact or with multiple bottom gate contacts.

In the voltage-controlled spin transistors described herein, the channel is provided by a layer of multiferroic material having both antiferromagnetic and ferroelectric orders. In an initial "on" state, the multiferroic material of the channel has a low domain density and, more preferably, is a monodomain multiferroic with a single electrical polarization domain (represented by down arrows). As used herein, the term "monodomain multiferroic" refers to a multiferroic material that has a uniform Neel vector (one antiferromagnetic domain) and polarization vector (one ferroelectric domain). Because it is difficult to grow layers of multiferroic materials that are perfectly monodomain, for the purposes of this disclosure a multiferroic material may be considered to be a monodomain material if at least 95%, and more preferably at least 98% or at least 99%, of the material is in a single ferroelastic, ferroelectric and magnetic domain.

As shown in the upper panel of FIG. 1, in a monodomain state, the electrical polarization of the material is oriented in the same direction throughout the channel, and the material has a substantially single magnetic domain with a single cycloidal magnetic polarity. In this initial state, spin current injected into the channel from the spin injector contact is able to flow through the multiferroic material to the spin detector contact via magnon propagation due to the low density, or complete absence, of domain boundaries. When a gate voltage is applied across the channel, the electrical polarization of the multiferroic material in the region of the channel subjected to the gate voltage 118 is switched and, due to magnetoelectric coupling between the ferroelectric and antiferromagnetic orders in the multiferroic material, magnetic polarity is also switched. As shown in the lower panel of FIG. 1, this ferroelectric switching creates a region in the channel between the top and bottom gate contacts in which the polarization is switched and new domain boundaries are formed. As a result, the application of the gate voltage increases the density of domain boundaries in the channel, which results in the attenuation of the spin current transport through the channel. If the multiferroic material is initially a monodomain material, the ferroelectric switching converts the monodomain multiferroic material into a multidomain multiferroic material. The attenuation of the spin current switches the spin transistor from the "on" state to the "off" state.

Without intending to be bound to any particular theory of the invention, the inventors believe that the attenuation in spin current transport can be attributed, at least in part, to spin current scattering at domain boundaries that form within the channel as a result of the switching of the ferroelectric order. In some embodiments of the spin transistors, a greater number of domain boundaries can be produced by using multiple (i.e., two or more) gates distributed along the length of the transistor channel.

Bismuth ferrite, $BiFeO_3$ ("BFO"), is an example of a multiferroic antiferromagnetic material that can be used as the channel in a voltage-controlled spin transistor. The use of BFO is advantageous because it is multiferroic at room temperatures (e.g., at temperatures in the range from about 22° C. to about 25° C.) and because it can be grown as a low domain density or monodomain material. The BFO may be doped or undoped. For example, BFO may be doped with lanthanum or other dopant atoms in order to adjust the gate voltage required to switch its electrical polarization. It is conceivable that other multiferroic materials could be used. However, since these would generally require operation at very low temperatures, their use is generally much less practical.

Monodomain BFO films can be grown epitaxially, as described in: Baek, S. H., e al. "Ferroelastic switching for nanoscale non-volatile magnetoelectric devices." *Nature materials* 9.4 (2010): 309-314, Saenrang, Wittawat, et al. "Deterministic and robust room-temperature exchange coupling in monodomain multiferroic $BiFeO_3$ heterostructures." *Nature communications* 8.1 (2017): 1-8; Price, N. Waterfield, et al. "Strain Engineering a Multiferroic Monodomain in Thin-Film $BiFeO_3$." *Physical Review Applied* 11.2 (2019): 024035; and Kuo. C-Y., et al. "Single-domain multiferroic $BiFeO_3$ films." *Nature communications* 7.1 (2016): 1-7. Detailed descriptions of the properties of monodomain (also referred to as single-domain) BFO and the epitaxial growth processes that can be used to form layers of monodomain BFO can be found in these references and in Example 1, below. Briefly, strained monodomain $(001)_{pc}$-oriented BFO films having ferroelectric and antiferromagnetic monodomain properties can be grown via epitaxial growth on $SrTiO_3$ (STO) single-crystal substrates with a 4° miscut toward the $[110]_{pc}$ direction having a thin $SrRuO_3$ (SRO) layer deposited thereon. An SRO layer may be deposited on the growth substrate prior to BFO growth. Upon the application of an external electrical field, the electronic polarization of the (001) BFO film undergoes a 71° reversal.

Monodomain $(111)_{pc}$-oriented BFO films having ferroelectric and antiferromagnetic monodomain properties can be grown via epitaxial growth on an $NdGaO_3$ (NGO) substrate or a $TbScO_3$ (TSO) substrate or oriented with the $(011)_o$ $((111)_{pc})$ direction specular (the subscript "o" indicates the Pnma orthorhombic setting) having a thin SRO layer deposited thereon. Notably, in addition to promoting monodomain growth, the SRO layers may serve as bottom gate contacts in the spin-transistors into which the monodomain BFO is incorporated as a spin current channel. Upon the application of an external electrical field, the electronic polarization of the (111) BFO film undergoes a 180° reversal.

The length of channel 106 will depend, at least in part, on the distance over which the multiferroic material is able to transport spin currents and also upon the required transistor performance properties. If small transistor footprints and high transistor densities are desired, smaller channel lengths may be preferred. However, longer channels may be preferred if maximizing the on/off ratio of the device is important. By way of illustration, various embodiments of the spin transistors have channel lengths in the range from 10 nm to 10 µm, including channel lengths in the range from 50 nm to 10 µm. However, the spin transistors described herein are not limited to those with channel lengths in this range. The channel thickness can be in the range of, for example, 100 nm to 200 nm. The spin transistors described herein are not limited to those with channel lengths in this range, but channel 106 should be sufficiently thick to avoid or minimize electrical leakage.

Figure 2:
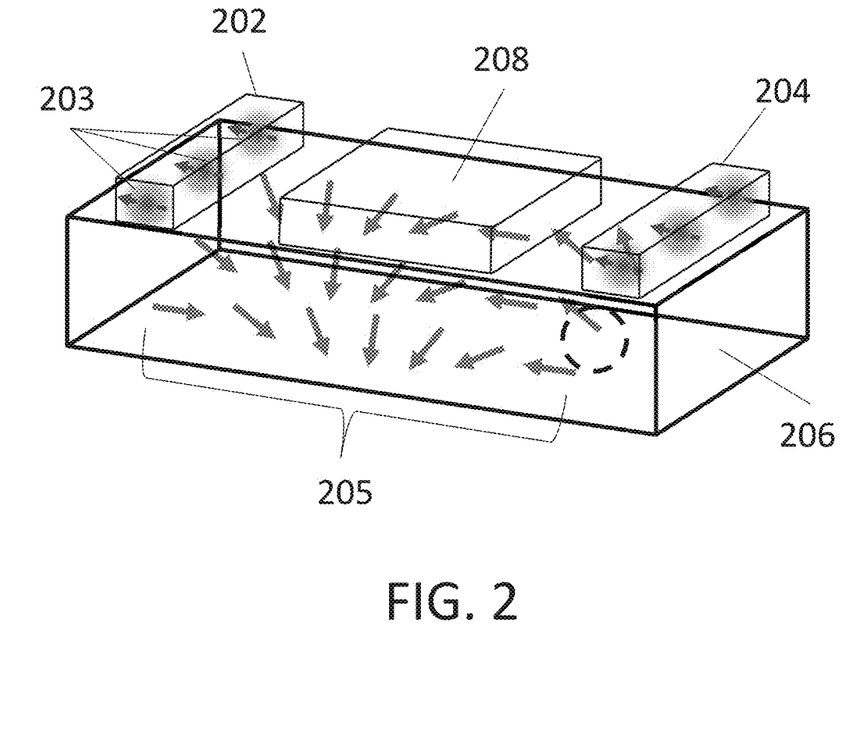
FIG. 2 is a schematic diagram of a voltage-controlled spin transistor showing magnon transport through a multiferroic antiferromagnetic channel (back gate contact not shown).

Spin injector contact 102 and spin detector contact 104 are composed of a material in which a spin current can be generated via the spin-Hall effect or the Rashba-Edelstein effect. Thus, suitable spin injector contact 102 and spin detector contact materials include those having a strong spin-orbit coupling. Such materials include heavy metals, two-dimensional electron gases (2DEGs), 4d/5d transition metal oxides, and topological insulators. Specific examples of such materials include metals, such as platinum (Pt), tantalum (Ta), tungsten (W), and the like. For example, as illustrated in FIG. 2, a spin current can be generated in a spin injector contact 202 by passing a current through the spin injector contact to generate a transverse spin current via the spin-Hall effect. As a result, spin 203 builds up at the interface between spin injector contact 202 and channel 206, and the spin current is injected into channel 206. The spin injected at the interface carries a net angular momentum and excites magnons 205 (represented by gray arrows), which propagate along the length of channel 206 to spin detector contact 204, where the spin current is absorbed and can be detected by the inverse spin-Hall effect or the inverse Rashba-Edelstein effect. Thus, in the spin transistors, the multiferroic material provides a magnon transport channel. Magnon transport along channel 206 is modulated using a top gate contact 208 and a bottom gate contact (not shown).

The dimensions of spin injector and spin detector contacts are not particularly limited, but these contacts can be made thin in order to facilitate transistor scale-down. For example, spin injector and spin detector contacts having thicknesses in the range from 3 nm to 10 nm and/or lengths in the range from 100 nm to 300 nm can be used. However, spin injector and spin detector contacts having dimensions outside of these ranges can also be used.

The top and bottom gate contacts are composed of electrically conductive materials. Typically, the top gate contact will be a metal, such as copper, gold, silver, and the like (as used herein, metals include metal alloys); however, electrically conductive non-metallic materials can also be used. As discussed above, an electrically conductive film (e.g., SRO) that is deposited over a growth substrate prior to the epitaxial growth of the multiferroic material can serve as the bottom gate electrode, which will typically be grounded. Other electrically conductive oxide perovskites could be used as a gate contact, including $LaSrMO_3$. A voltage source (not shown) is connected across the top and bottom gate contacts to apply an external electric field across the channel to provide voltage control of magnon transport through the multiferroic channel, as described above. Typical, non-limiting examples of gate contact thicknesses include those in the range from 5 nm to 20 nm. The top gate contact may be nearly as long as the channel, but should avoid electrical connection with the spin injection and spin detection contacts.

EXAMPLES

Example 1

The example illustrates how monodomain BFO can be grown and characterized.

BFO. BFO is a well-known multiferroic material that is ferroelectric (FE), ferroelastic, and antiferromagnetic (AFM) at room temperature with ferroelectricity extending to $T_C \sim 1100$ K and antiferromagnetism extending to $T_N \sim 640$ K. Structurally, BFO retains a rhombohedral structure (R3C) with a perovskite structure of bismuth atoms on the corners of the unit cell and an iron atom at the body centered position caged by a octahedron of oxygen atoms. Electrically, BFO is polar with a positive charge on one end of the rhombohedral distorted <111> direction and negative charge on the direct opposite end. Four unique ferroelastic distortions are allowed in the BFO structure each with a structural distortion along a different set of opposite <111> directions. For each ferroelastic variant, there are two unique ferroelastic variants with the polarization orientated along the +<111> direction or along the −<111> direction. Furthermore, each of the eight unique combinations of one of four ferroelastic domains and one of two ferroelectric domains, has three possible antiferromagnetic domains. Each AFM domain is defined by a spin cycloidal structure with a wavelength of 64 nanometers, each with a propagation vector direction 120 degrees apart lying in the {111} plane.

Domain engineering of monodomain BFO thin films. When BFO is grown as an epitaxial thin film, the domain structure can be influenced by the materials BFO is grown on. Substrate symmetry and orientation can both be used to manipulate the ferroelastic and antiferromagnetic domain populations of a BFO film and adding a polar buffer layer can further constrain the whole film to a single ferroelectric domain (with the polarization vector either pointing toward or away from the buffer layer).

Typically, a BFO thin film grown on a single crystal $SrTiO_3$ (STO) substrate has equal populations of each ferroelastic domain. For the (001) normal BFO thin film system, starting with a substrate with a surface that is purposely miscut at an angle from the exact (001) surface, can affect the domain populations of the four ferroelastic domains. Domains with polarizations pointing into the step edge of the miscut are preferred over other domain orientations to minimize strain in the film. When the miscut is in the [100] direction, the energetically favored domains are cut in half to two. When the miscut is in the [110] direction, the ±[111] polarization domain is the most preferred.

Figure 3A:
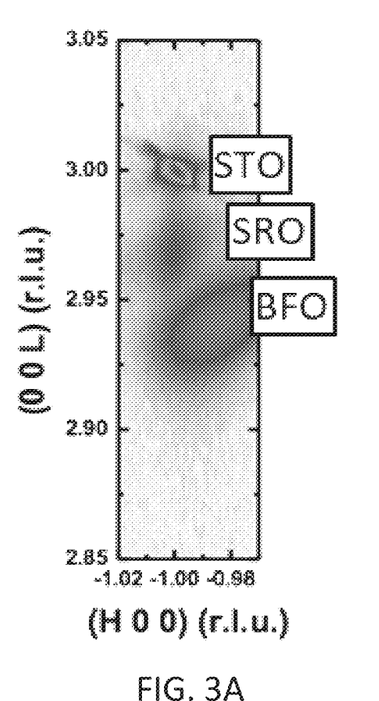
FIG. 3A. Reciprocal space map showing the (103) diffraction peaks of an STO substrate, an SRO buffer layer, and a BFO thin film.
Figure 3B:
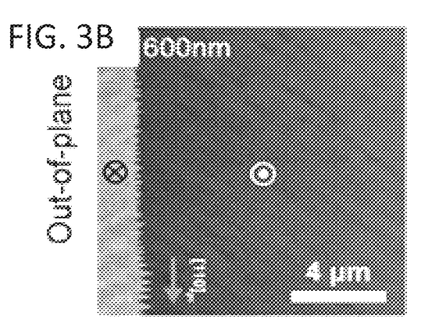
FIG. 3B and FIG. 3C: Out-of-plane (FIG. 3B) and in-plane (FIG. 3C) piezoforce microscopy images of a 600 nm thick BFO thin film where the very left part of the scanned area is in the as-grown domain state and the rest of the area has been switched to the up-state. A domain wall exists between the two domains. The in-plane component of the two domains is identical.
Figure 3C:
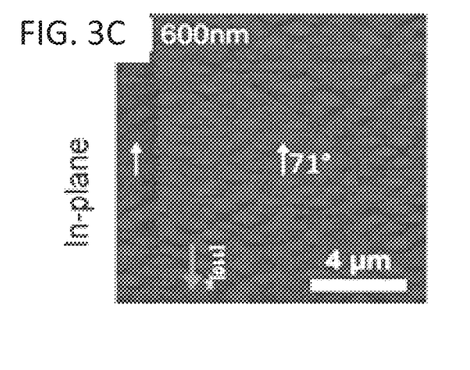

These results can be confirmed with X-ray diffraction due to the unique structural distortion each ferroelastic domain variant will have in reciprocal space (FIG. 3A). Along with confirming a single peak in the reciprocal space mapping (RSM) of the thin film, piezoelectric force microscopy (PFM) can map the domains on the surface of the thin film. The voltage applied to the scanning tip changes the size of the domains, BFO is piezoelectric, deflecting the tip (FIGS. 3B and 3C).

Figure 4A:
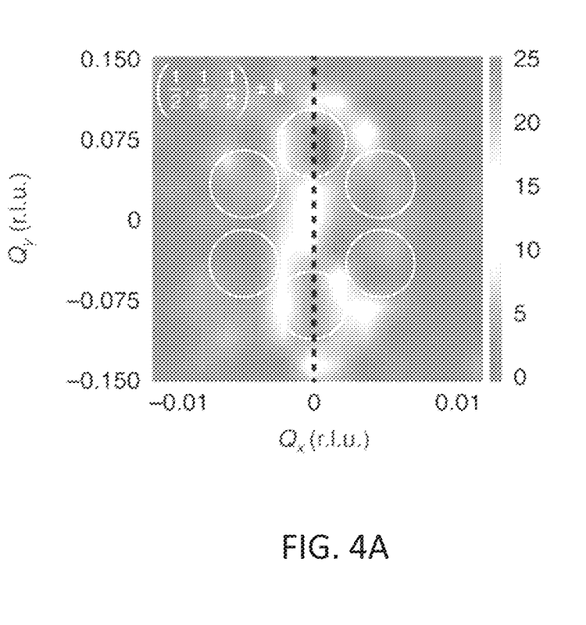
FIG. 4A and FIG. 4B. NXMS images of a BFO(001) thin film on [110] miscut STO(001) (FIG. 4A) and of a BFO(111) thin film on $TSO(011)_o$ (FIG. 4B). Both images show two peaks, one for each direction along a single propagation vector proving the monodomain nature of both films.

To probe the magnetic domain structure of the BFO, non-resonant x-ray magnetic scattering (NXMS) measurements were performed using synchrotron radiation (as x-ray magnetic interactions are 10' weaker than electronic interactions). These measurements confirm that a single AFM domain is present in the film, as the propagation vector that lies in-plane is energetically preferred over the other two which lie out-of-plane (FIG. 4A).

Figure 4B:
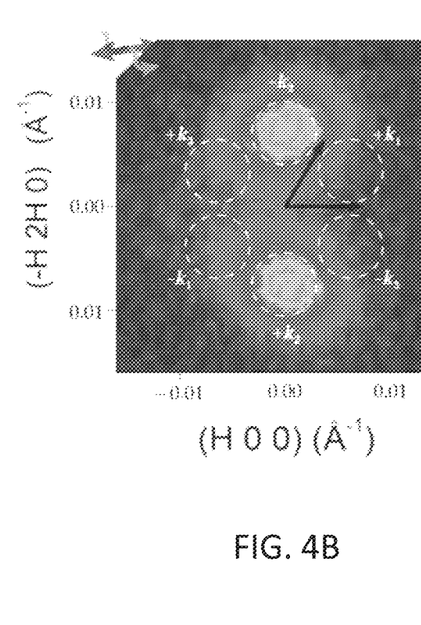

For the (111) normal BFO system, no miscut is needed. The ferroelastic/ferroelectric combination that has a polarization direction pointed directly down into the film is energetically preferred over all others. Again, this was confirmed using results from RSM and PFM. However, when grown on cubic STO(111), all three AFM domains are allowed. Growing the BFO(111) film on a substrate having lower symmetry than STO(111), such as orthorhombic TSO or $NGO(011)_o$, broke the symmetry and selected for a single AFM domain (FIG. 4B). Ferroelectric switching of the BFO changed the chirality of the spin cycloid from left-handed to right-handed.

Example 2

The example demonstrates the spin transport capabilities of monodomain $BiFeO_3$ that render it well-suited for use as a spin channel in a spin transistor.

Figure 5A:
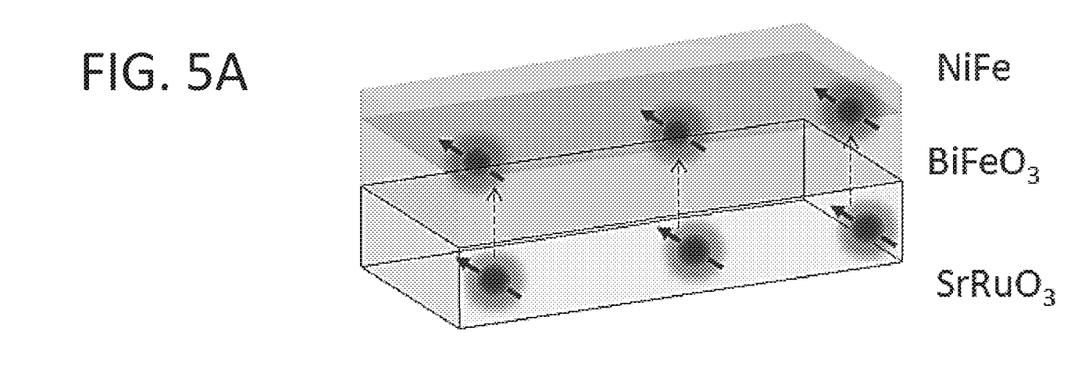
FIG. 5A is a schematic diagram of a $NiFe/BiFeO_3/SrRuO_3$ trilayer structure.

Spin transport in an insulating $BiFeO_3$ thin film was demonstrated using a lateral $NiFe/BiFeO_3/SrRuO_3$ trilayer structure (FIG. 5A) which was grown on a (110) oriented $DyScO_3$ substrate. In these kinds of orthorhombic substrates, the strain induces a striped ferroelectric domains structure in $BiFeO_3$ with two polarization variants. The working principle of the trilayer device can be understood as the bottom $SrRuO_3$ layer serving as the spin injector, which generates the transverse spin currents, and the top NiFe layer serving as the spin detector, which senses how much of generated spin currents are diffused through the $BiFeO_3$. More specifically, because of the strong spin-Hall effect in $SrRuO_3$, longitudinal charge current $J_c$ (in-plane direction) flowing in the $SrRuO_3$ led to the creation of transverse spin currents carrying the spin angular momentum and the accumulation of spin at the $BiFeO_3/SrRuO_3$ interface. When such spin angular momentum was transferred into the $BiFeO_3$, magnons were, enabling the diffusion of spin currents through the BiFeO$_3$ to the NiFe/BiFeO$_3$ interface. The spin currents that were absorbed by the NiFe exerted a spin torque onto the NiFe magnetization. The extent of spin current J$_d$ diffusion through the BiFeO$_3$ channel (and the NiFe/BiFeO$_3$ interface) was estimated by measuring the charge of the NiFe, and the ratio between J$_d$ and J$_c$ was defined as an effective spin-torque ratio in the trilayer. This ratio parameterizes the efficiency of the spin torque absorption in the NiFe from the spin-Hall source SrRuO$_3$. The spin diffusion length of the insulating BiFeO$_3$ was then determined by the decay of the effective spin-torque ratio. Here, the effective spin-torque ratio in the trilayer was measured by using spin-torque ferromagnetic resonance (ST-FMR), which is a standard technique for measuring the spin-torque ratio in various materials systems.

Figure 5B:
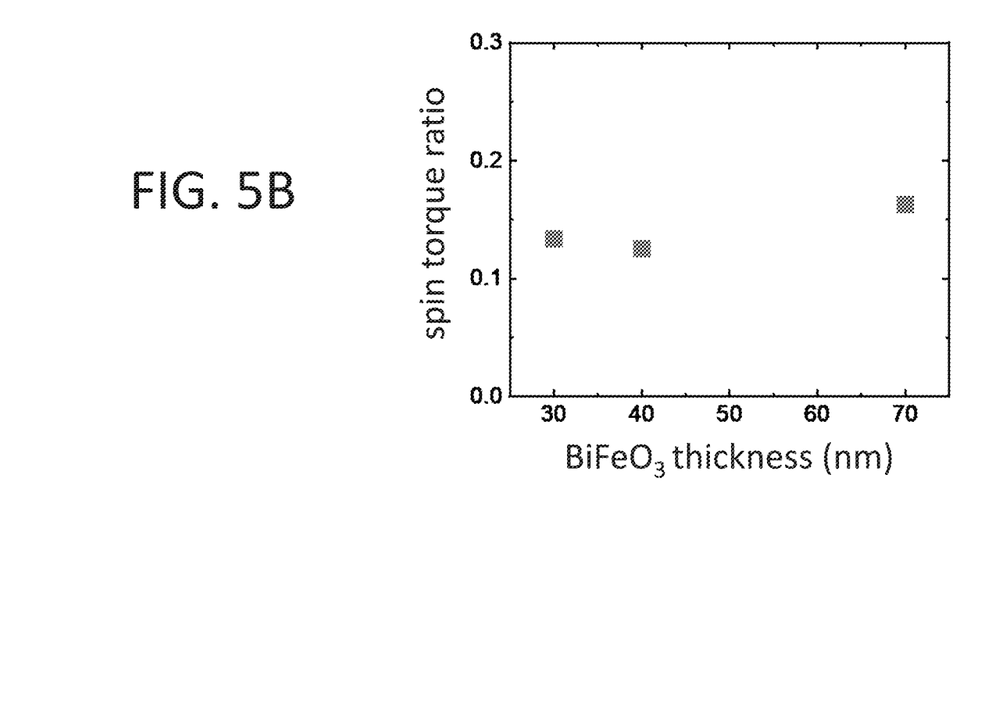
FIG. 5B shows the effective spin-torque ratio as a function of the $BiFeO_3$ layer thickness for the trilayer structure of FIG. 5A.

FIG. 5B shows the effective spin-torque ratio as a function of the BiFeO$_3$ thickness from 30 nm to 70 nm (the thicknesses of SrRuO$_3$ and NiFe were fixed at 15 nm and 9 nm, respectively), where the spin-torque ratio was almost constant, indicating no decay of the spin current in this thickness range. A slight increase of the effective spin-torque ratio at 70 nm possibly suggests the correlation between the spin transport property and the crystalline quality of BiFeO$_3$ thin film, since the thicker BiFeO$_3$ has a better crystalline quality. These results demonstrate a long spin diffusion length in the BiFeO$_3$ thin film and its capability to be used as the magnon channel in spin transistors.

Experimental Details.

For (001)-orientated BFO thin films, (001)$_{pc}$ SrTiO$_3$ single-crystal substrates with 4° miscut toward [1$\bar{1}$0]$_{pc}$ direction (where the subscript "pc" indicates the Pm$\bar{3}$m cubic setting) were used to create a single ferroelectric and single antiferromagnetic domain of BFO. For (111)-orientated BFO thin films, (011)$_o$ NdGaO$_3$ single-crystal substrates with nominally no miscut were used. A 30 nm thick SrRuO$_3$ bottom electrode layer was first deposited by 90° off-axis RF magnetron sputtering at 600° C. with a chamber pressure of 200 mTorr at a 3:2 ratio of Ar:O$_2$ and cooled down to room temperature in 300 Torr of O$_2$. The 2-inch diameter stoichiometric target material was kept at 100 watts. BFO films were grown by double-gun off-axis RF magnetron sputtering at 740° C. with an Ar:O$_2$ ratio of 3:1 at a chamber pressure of 400 mTorr. The BFO target contained 5% excess Bi$_2$O$_3$ to compensate for bismuth volatility. To make the target, B$_2$O$_3$ and Fe$_2$O$_3$ were ball milled together for 1 hour, dried, sieved, and then calcined at 800° C. for 4 hours. The calcined mixture was re-milled, dried, sieved, and pressed at 10 tons. The final sintering was done at 850° C. for 2 hours and then raised to 910° C. for 8 hours.

For metallic overlayers (i.e., spin injection and spin detection contacts), such as NiFe and Pt, DC sputtering can be used and is done usually in-situ with the BFO layer to maintain a clean interface; otherwise cleaning of the BFO surface by heating, plasma cleaning, or by minimizing transfer times can be done. Patterning of device structure can be done lithographically with a photoresist mask and ion-milling. For switching experiments where the BFO is to be ferroelectrically switched, the device is contacted using a probing station or by wire bonding after the substrate has been mounted to a chip carrier.

Device Principles.

As discussed in Example 1, BFO is a multiferroic material that has ferroelectric, ferroelastic, and antiferromagnetic orders which are coupled together. By applying a voltage across a BFO thin film, not only can the ferroelectric order be changed, so can the magnetic order. Engineering of the structural template on which epitaxial BFO thin films are grown can set the order of the whole thin film going from the 24 possible domain variants to just 1 when grown on a polar buffer layer as well, as described in detail in Example 1. This example shows that magnon transport through BFO is long enough such that spin waves generated in one part of the film can be detected at another part of the film. Because the BFO is monodomain, no signal degradation from domain walls is present. As there are no domain walls in the as-grown BFO thin film, adding back domain walls by switching regions of the BFO channel can act as the on/off functionality of a transistor. By switching the BFO regions disposed beneath a metallic overlayer pad (i.e., a FE gate contact), the monodomain BFO channel between the spin injector and the spin detector can be turned into a mix of up and down domains with domain walls between each domain.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A voltage-controlled spin transistor comprising:
   a spin injector contact;
   a spin detector contact;
   a layer of a multiferroic material having a first density of antiferromagnetic and ferroelectric domain boundaries that forms a three-dimensional channel for the propagation of magnons between the spin injector contact and the spin detector contact when said magnons are excited in the layer of multiferroic material by the net angular momentum of spin current injected into the multiferroic material from the spin injector contact, the layer of multiferroic material having a top surface and a bottom surface, wherein the propagation of the magnons extends into the multiferroic material below the top surface of the layer of multiferroic material and above the bottom surface of the layer of multiferroic material;
   at least one top gate contact; and
   at least one bottom gate contact,
   wherein the at least one top gate contact and the at least one bottom gate contact are configured to apply a gate voltage across the channel, the voltage-controlled spin transistor characterized in that the application of the gate voltage across the channel increases the density of the antiferromagnetic and ferroelectric domain boundaries in the multiferroic material.

2. The spin transistor of claim 1, wherein the multiferroic material is a monodomain multiferroic material in the absence of the gate voltage.

3. The spin transistor of claim 1, wherein the multiferroic material is BiFeO$_3$.

4. The spin transistor of claim 3, wherein the BiFeO$_3$ is (001)$_{pc}$-oriented BiFeO$_3$ on a SrTiO$_3$ (STO) single-crystal substrate with a 4° miscut toward the [110]$_{pc}$ direction.

5. The spin transistor of claim 3, wherein the BiFeO$_3$ is (111)$_{pc}$-oriented BiFeO$_3$ on an NdGaO$_3$ (NGO) substrate or a TbScO$_3$ (TSO) substrate.

6. The spin transistor of claim 3, wherein the BiFeO$_3$ is monodomain multiferroic BiFeO$_3$.

7. The spin transistor of claim 6, wherein the spin injector contact comprises SrRuO$_3$ and the top gate contact comprises a metal.

8. A method of operating the spin transistor comprising:
a spin injector contact;
a spin detector contact;
a layer of a multiferroic material having a first density of antiferromagnetic and ferroelectric domain boundaries that forms a three-dimensional channel for the propagation of magnons between the spin injector contact and the spin detector contact when said magnons are excited in the layer of multiferroic material by the net angular momentum of spin current injected into the multiferroic material from the spin injector contact, the layer of multiferroic material having a top surface and a bottom surface, wherein the propagation of the magnons extends into the multiferroic material below the top surface of the layer of multiferroic material and above the bottom surface of the layer of multiferroic material;
at least one top gate contact; and
at least one bottom gate contact,
wherein the at least one top gate contact and the at least one bottom gate contact are configured to apply a gate voltage across the channel, the method comprising:
creating a spin current in the spin injector contact, whereby the spin current is injected into the channel and excites magnons that propagate between the spin injector contact and the spin detector contact; and
applying a gate voltage across the three-dimensional channel, wherein the application of the gate voltage increases a density of antiferromagnetic and ferroelectric domain boundaries in the multiferroic material and attenuates the propagation of the magnons in the channel.

9. The method of claim 8, wherein the multiferroic material is a monodomain multiferroic material prior to the application of the gate voltage.

10. The method of claim 8, wherein the multiferroic material is BiFeO$_3$.

11. The method of claim 10, wherein the BiFeO$_3$ is (001)$_{pc}$-oriented BiFeO$_3$ on a SrTiO$_3$ (STO) single-crystal substrate with a 4° miscut toward the [110]$_{pc}$ direction.

12. The method of claim 10, wherein the BiFeO$_3$ is (111)$_{pc}$-oriented BiFeO$_3$ on an NdGaO$_3$ (NGO) substrate or a TbScO$_3$ (TSO) substrate.

13. The method of claim 10, wherein the BiFeO$_3$ is monodomain multiferroic BiFeO$_3$.

14. The method of claim 13, wherein the spin injector contact comprises SrRuO$_3$ and the top gate contact comprises a metal.

* * * * *